(12) United States Patent
Dielt et al.

(10) Patent No.: US 7,408,415 B2
(45) Date of Patent: Aug. 5, 2008

(54) VOLTAGE CONTROLLED OSCILLATOR PHASE LOCKED LOOP CIRCUIT WITH LOOP FILTER CAPACITANCE TUNING

(75) Inventors: Markus Dielt, Munich (DE); Elmar Werkmeister, Singen (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/288,004

(22) Filed: Nov. 28, 2005

(65) Prior Publication Data

US 2007/0120609 A1 May 31, 2007

(30) Foreign Application Priority Data

Nov. 26, 2004 (DE) .................. 10 2004 057 186

(51) Int. Cl.
*H03L 7/00* (2006.01)
(52) U.S. Cl. .................. 331/16; 331/10; 331/14; 331/17; 331/34; 331/177 R; 331/179
(58) Field of Classification Search .......... 331/10, 331/14, 16, 17, 34, 177 R, 179
See application file for complete search history.

(56) References Cited

U.S. PATENT DOCUMENTS 6,175,282 B1 * 1/2001 Yasuda .................. 331/44
6,888,413 B1 * 5/2005 Adams et al. ............. 331/17
6,956,416 B2 * 10/2005 Wilson et al. ............. 327/156

* cited by examiner

Primary Examiner—Benny Lee
Assistant Examiner—Levi Gannon
(74) Attorney, Agent, or Firm—Warren L. Franz; Wade J. Brady, III; Frederick J. Telecky, Jr.

(57) ABSTRACT

A phase locked loop circuit comprises a voltage controlled oscillator with a control input to which a variable control voltage is applied and a phase-frequency discriminator with an output connected to a loop filter to produce the control voltage. To provide the phase locked loop circuit with a low loop gain and a wide frequency pulling range, a plurality of discrete capacitors is associated with the voltage controlled oscillator. A switch array selectively activates and deactivates each of the capacitors in the voltage controlled oscillator. Each number of currently activated capacitors determines one out of a plurality of partial ranges of frequencies through which the oscillator can be tuned by a variation of the control voltage in a range between predetermined upper and lower control voltage limits. A total frequency range through which the oscillator can be tuned is divided thus into a plurality of partial frequency ranges each defined by a different number of activated capacitors.

7 Claims, 3 Drawing Sheets

VOLTAGE CONTROLLED OSCILLATOR PHASE LOCKED LOOP CIRCUIT WITH LOOP FILTER CAPACITANCE TUNING

The present invention relates to a phase locked loop circuit with a voltage controlled oscillator that has a control input to which a variable control voltage is applied.

BACKGROUND

When a phase locked loop (PLL) operating as a variable frequency oscillator is intended to have a wide frequency pulling range and the frequency variation is achieved with a variable capacitance element in an analog control loop, the control loop must have a high gain. A high loop gain may cause high phase and/or frequency jitter. These problems limit the frequency pulling range that can be achieved with an analog control loop.

SUMMARY

The present invention provides a phase locked loop circuit with a low loop gain and a wide frequency pulling range.

In a described embodiment, the phase locked loop circuit comprises a voltage controlled oscillator that has a control input to which a variable control voltage is applied and a phase-frequency discriminator with an output connected to a loop filter to produce the control voltage. A plurality of discrete frequency tuning elements, e.g. capacitors, is associated with the voltage controlled oscillator. A switch array selectively activates and deactivates each of the frequency tuning elements in the voltage controlled oscillator. Each number of currently activated frequency tuning elements determines one out of a plurality of partial ranges of frequencies through which the oscillator can be tuned by a variation of the control voltage in a range between predetermined upper and lower control voltage limits. A total frequency range through which the oscillator can be tuned is divided into a plurality of partial frequency ranges each defined by a different number of activated frequency tuning elements. Since each partial frequency range can be relatively narrow, the control loop needs only a low loop gain. The total frequency range through which the oscillator can be tuned mainly depends on the number of capacitors that can be selectively activated. Thus, the inventive phase locked loop circuit combines analog with digital control of the loop to achieve low analog gain and a wide frequency pulling range.

In one arrangement, the partial frequency ranges overlap each other so that the control loop may always operate in a linear range.

To control the selective activation and deactivation of the frequency tuning elements, a threshold comparator monitors the control voltage and controls the switching array to activate or deactivate one of the frequency tuning elements when either of the upper and lower control voltage limits is reached or exceeded. However, since the oscillator responds immediately to a change of the capacitance that determines its frequency and the control voltage needs much more time to react to the change of frequency, preferred embodiments of the invention have an inhibiting circuit which is set whenever one of the capacitors is activated or deactivated to inhibit an activation or deactivation of further frequency tuning elements. The inhibiting circuit is reset only after the control voltage has evolved away from the upper or lower control voltage limit by a predefined amount. Preferably, the control voltage is forced away from the control voltage limit during the set condition of the inhibiting circuit. Since the loop filter normally includes a filter capacitance charged to the control voltage, the phase-frequency discriminator is functionally disconnected from the loop filter during the set condition of the inhibiting circuit, and the capacitance is selectively connected to a charge sink or to a charge source to reduce or increase the control voltage applied to the control input of the voltage controlled oscillator.

Although the analog loop gain remains constant within each partial frequency range of the oscillator, it changes from one partial range to another. Since a change in loop gain affects the bandwidth of the loop and a change of bandwidth is detrimental to the performance of the loop, the described implementation provides a compensation mechanism. Specifically, a charge pump associated with the loop filter is supplied with a charge current that is varied in accordance with the number of activated capacitors or the particular partial frequency range in which the oscillator operates, in a manner to keep the bandwidth of the loop substantially constant throughout the total pulling range of the oscillator.

BRIEF DESCRIPTION OF THE DRAWINGS

Further advantages and features of the invention will be apparent from the description of example embodiments, with reference to the accompanying drawings, wherein.

DETAILED DESCRIPTION OF THE EMBODIMENTS

Figure 1:
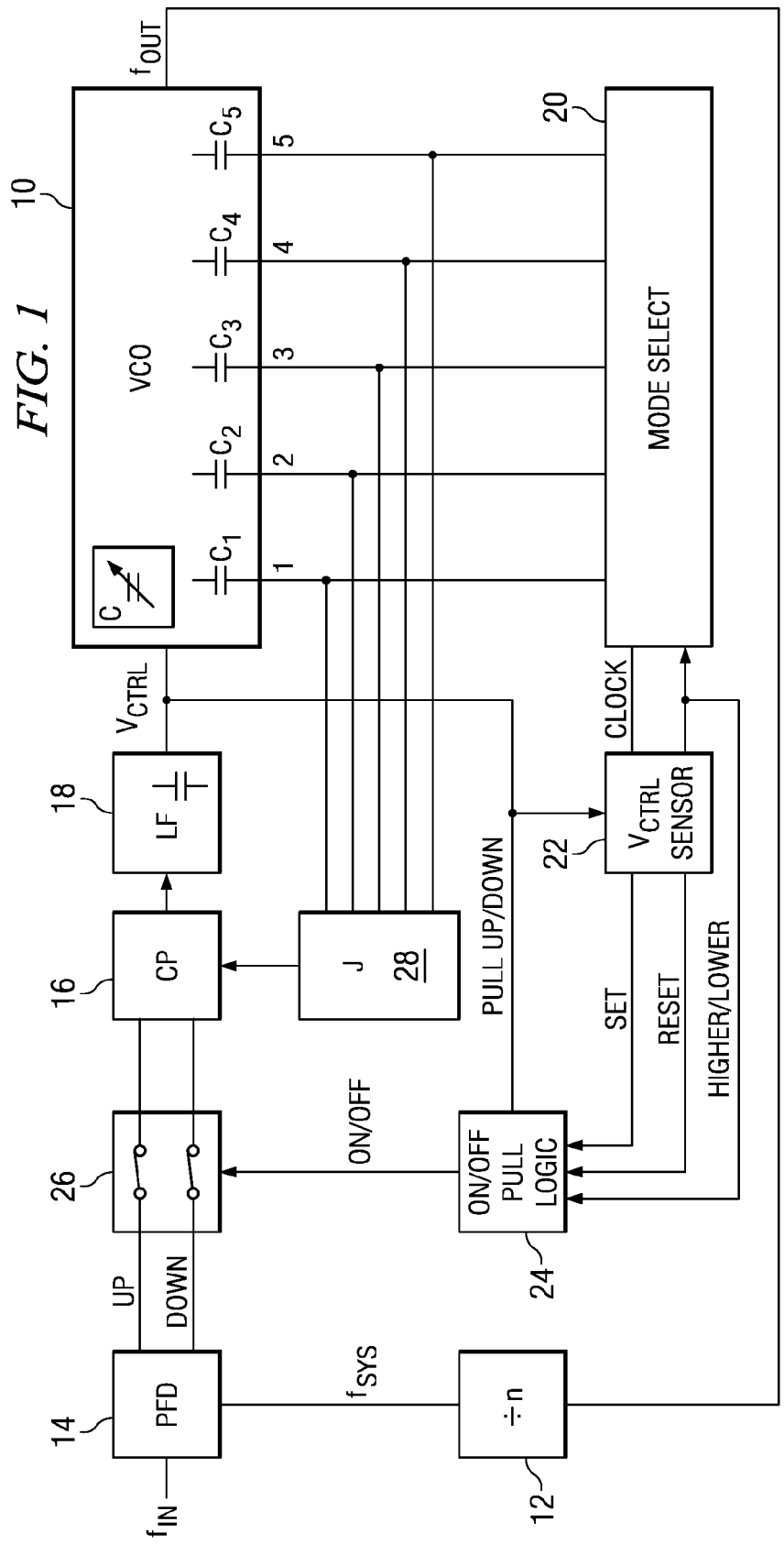
FIG. 1 is a block diagram of a phase locked loop circuit embodiment illustrating principles of the invention.

The phase locked loop (PLL) circuit in FIG. 1 is a variable frequency oscillator. In a generally conventional manner, the analog control loop includes a voltage controlled oscillator (VCO) 10, a frequency divider 12 connected to the output of the VCO 10, a phase-frequency discriminator (PFD) 14 having a first input connected to the output of the frequency divider 12 and a second input which receives a reference frequency fin, a charge pump (CP) 16 connected to the "up" and "down" outputs of the PFD 14, and a loop filter (LF) 18 having an input connected to the output of the CP 16 and an output connected to a control input of the VCO 10 and providing a frequency control signal $V^{CRTL}$. The frequency divider 12 divides by "n" the output of the VCO 10 at frequency $f_{out}$ to provide a system frequency $f_{sys}$.

The VCO 10 includes a variable capacitor C and a number of fixed capacitors $C_1$ to $C_5$, the number of which is of course chosen for purposes of example only. Each of the fixed capacitors $C_1$ to $C_5$ can be selectively switched functionally in parallel with variable capacitor C by a switching array contained within VCO 10. The capacitance of variable capacitor C is controlled by the control voltage $V_{CRTL}$. The effective capacitance that determines the operating frequency of the oscillator is the sum of the capacitances of capacitor C and any of the fixed capacitors $C_1$ to $C_5$ connected in parallel by the switching array within VCO 10. It should be understood that in an actual circuit design in CMOS technology, the capacitors C and $C_1$ to $C_5$ would be distributed between the stages of a ring oscillator that would typically form the variable frequency oscillator.

The VCO 10 has one control input for each of the fixed capacitors $C_1$ to $C_5$. The control inputs "1" to "5" are connected to corresponding outputs of a mode select circuit 20. The mode select circuit 20 has a clock input and a control input, both connected to corresponding outputs of a control voltage sensor 22. The outputs of the mode select circuit 20 are "thermometer coded", i.e., the greater the number of outputs that have a logic "high" value, the greater the number of the fixed capacitors $C_1$ to $C_5$ that will be activated (switched in parallel with capacitor C) by the switching array within VCO 10.

The control voltage sensor 22 has an input connected to the output of LF 18 to receive the control voltage $V_{CRTL}$. The control voltage sensor 22 compares the control voltage $V_{CRTL}$ to predetermined upper and lower reference voltage levels. Whenever the control voltage $V_{CRTL}$ reaches one of these voltage levels, the control voltage sensor supplies a clock pulse to the mode select circuit 20. At the same time, the control voltage sensor 22 supplies a "higher/lower" control signal indicative of whether the upper or lower reference level is reached and whether a fixed capacitor is to be activated or deactivated, so that a corresponding output of the mode select circuit 20 is changed from one logic state to the opposite logic state.

The "higher/lower" control signal is also fed to a control input of a logic circuit 24. A first output of the logic circuit 24 is connected to the output of the LF 18. A second output of the logic circuit 24 is connected to a control input of a switch 26 connected between the outputs of the PFD 14 and the inputs of the CP 16. The logic circuit 24 further has inputs "Set" and "Reset" connected to corresponding outputs of the control voltage sensor 22.

A controllable load current source 28 is associated with the charge pump CP 16 to supply a variable charge current, and has control inputs connected to the outputs "1" to "5" of the mode select circuit 20.

Figure 2:
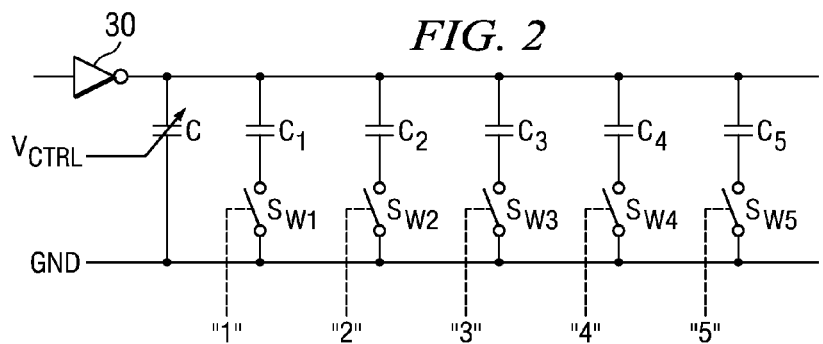
FIG. 2 is a schematic diagram illustrating a variable capacitance in a voltage controlled oscillator.

In FIG. 2, an inverting buffer 30 has variable capacitor C and fixed capacitors $C_1$ to $C_5$ connected to its output. Buffer 30 may be one out of, e.g., five stages of a ring oscillator in the VCO 10. Each of the fixed capacitors $C_1$ to $C_5$ has one terminal connectable to ground GND through a corresponding switch SW1 to SW5 of the switching array within VCO 10. Each switch SW1 to SW5, is controlled by a corresponding one of the control inputs "1" to "5". By selectively controlling the switches SW1 to SW5, the corresponding capacitors $C_1$ to $C_5$ are connected in parallel with capacitor C.

Figure 3:
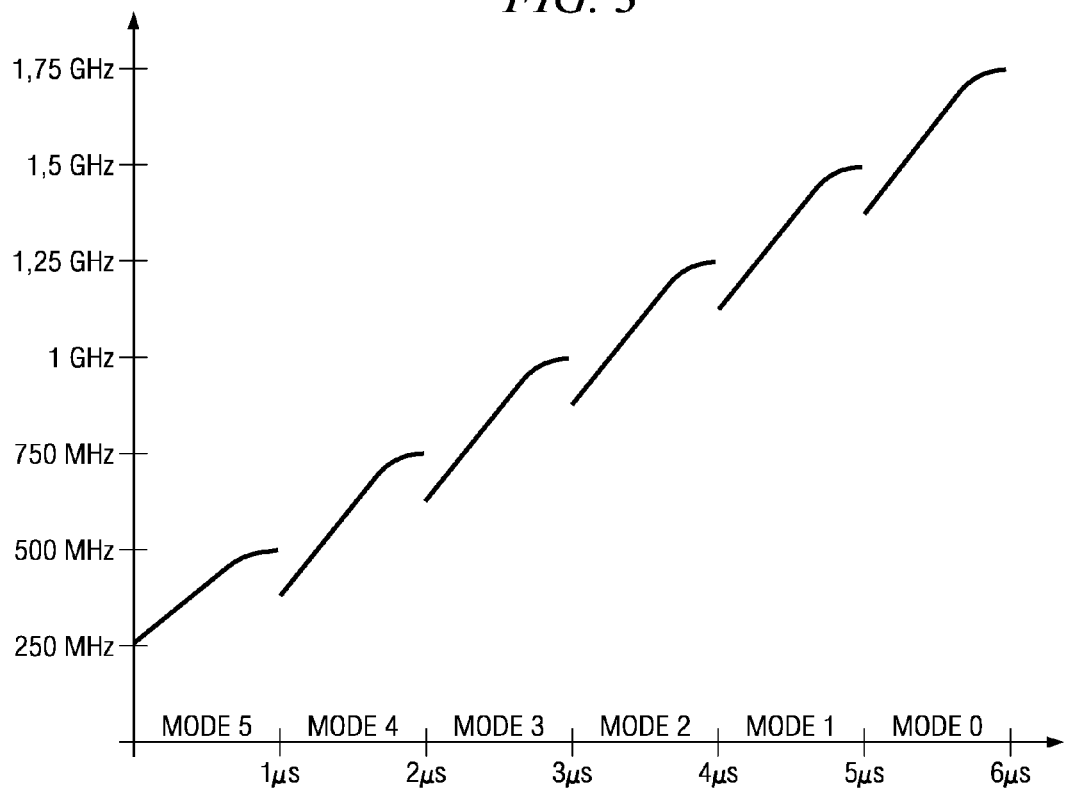
FIG. 3 is a chart showing overlapping partial frequency ranges of the oscillator.

In the example embodiment illustrated in FIG. 3, a total frequency pulling range extending from 250 MHz to 1.75 GHz is divided into six partial ranges referred to as "modes" 0 to 5. Mode 0 corresponds to all capacitors $C_1$ to $C_5$ being deactivated and is thus the highest partial frequency range. Mode 5 corresponds to all capacitors $C_1$ to $C_5$ being activated and is thus the lowest partial frequency range. The partial frequency ranges overlap each other at the upper and lower ends. In the example shown, each mode is tuned in a time period of 1 µs by varying the control voltage $V_{CRTL}$ through the available range of substantially linear loop operation.

Figure 4:
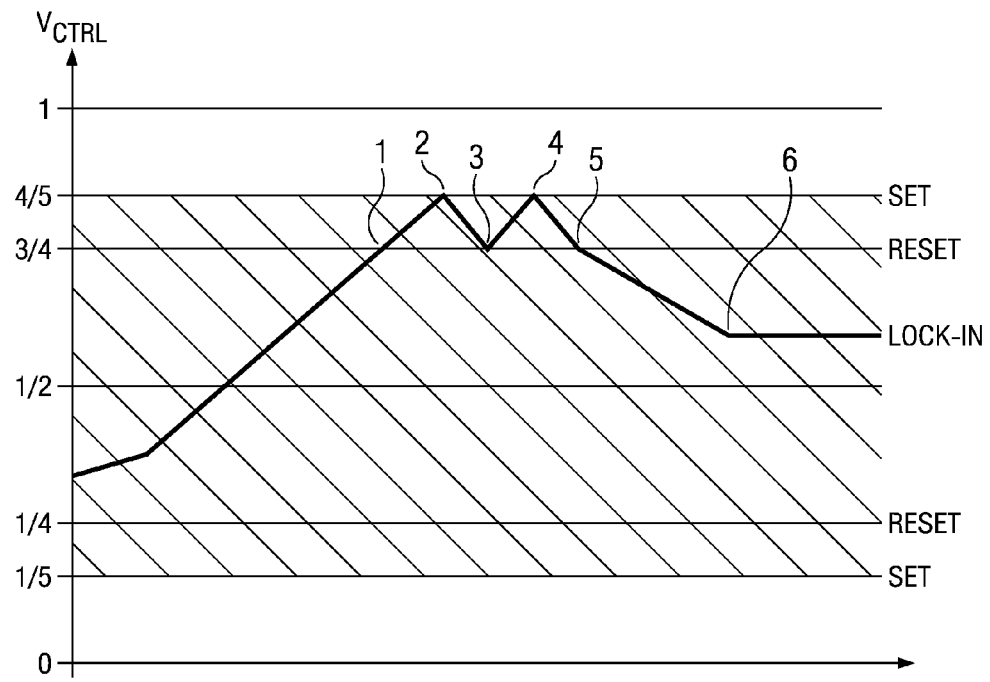
FIG. 4 is a diagram that illustrates the evolution of a control voltage in operation of the oscillator.

FIG. 4 illustrates a process where the input frequency fin to PFD increases and the control $V_{CRTL}$ increases accordingly. At point "2" in the diagram, the control voltage reaches a predetermined upper reference voltage level designated "⅘", which is a ⅘ fraction of a fixed reference voltage. The control voltage sensor 22 now delivers to mode select circuit 20 a clock pulse and a control signal "higher" so that the mode select circuits 20 forces one of its outputs from logic "high" to logic "low", thereby deactivating one of the capacitors $C_1$ to $C_5$ in VCO 10. Simultaneously, the control voltage sensor 22 delivers to the logic circuit 24 a "Set" signal and the "higher" signal. The logic circuit now inhibits the PFD 14 by opening switch 26 and disconnecting the PFD 14 from the charge pump 16. In addition, the logic circuit 24 connects the output of LF 18 to a current sink to discharge the capacitance contained therein, thereby reducing the control voltage $V_{CRTL}$ until point "3" in the diagram of FIG. 4 is reached. In a practical implementation, the capacitance in LF 18 would be discharged to ground through a pull-down resistor. At point "3" in FIG. 4, the control voltage sensor 22 detects a control voltage of another fraction of the fixed reference voltage, ¾ in this example. The control sensor 22 now delivers a "Reset" signal to logic circuit 24, which causes switch 26 to close, and disconnects the output of LF 18 from the current sink. If the oscillator frequency is still too low, the control voltage $V_{CRTL}$ increases again from point "3" and the mode switching process is repeated at point "4". At point "5", the control voltage $V_{CRTL}$ reaches the ¾ fraction of the reference voltage, and the logic circuit 24 returns to its non-inhibiting condition.

In FIG. 4, it is assumed that the frequency is too high after the second mode switching step so that the control loop reduces the control voltage $V_{CRTL}$ after point "5" until the control loop locks in at point "6".

The inhibiting and pull-down functions of the logic circuit allow the control loop sufficient time to adapt the control voltage after each mode switching step. A similar process as the one illustrated in FIG. 4 occurs when the frequency fin of the input signal is reduced. In this case, a lower predetermined reference voltage is a ⅕ fraction of the fixed reference voltage and a ¼ fraction is the level at which the control voltage sensor 22 delivers a "Reset" signal to logic circuit 24. To raise the control voltage after a mode switching step wherein a fixed capacitor is activated, the logic circuit 24 would connect the output of LF 18 to a current source through a pull-up resistor.

To maintain substantially constant the bandwidth of the loop over the entire frequency pulling range, the current source 28 supplies a variable current to the charge pump CP 16 in accordance with the current operating mode of the oscillator.

Figure 5:
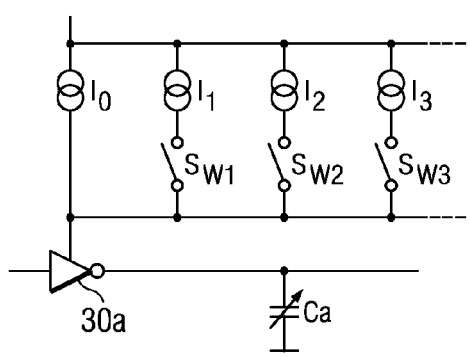
FIG. 5 is a schematic diagram of an alternative frequency tuning circuit.

In the FIG. 5 embodiment, an inverting buffer 30a has a variable capacitor Ca connected to its output. Buffer 30a is supplied from a plurality of current sources $I_0, I_1, I_2, I_3, \ldots$ that can be connected in parallel by means of an array of switches $Sw_1, Sw_2, Sw_3, \ldots$ As in FIG. 2, the arrangement shown is but one stage of the ring oscillator that forms the VCO. The greater the number of current sources connected in parallel, the faster the capacitor Ca will be charged and the higher will be the frequency of the oscillator.

Figure 6:
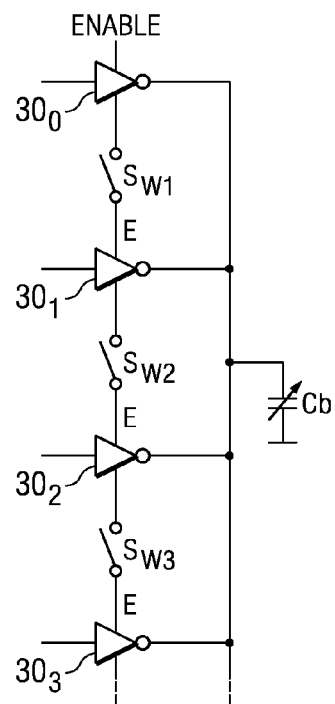
FIG. 6 is a schematic diagram of a further alternative frequency tuning circuit.

In the FIG. 6 embodiment, buffer stages $30_0, 30_1, 30_2, 30_3, \ldots$ are connected in parallel to variable capacitor Cb and can be selectively enabled by application of an appropriate control signal to an enable input. Each of the enable inputs E of buffer stages $30_1, 30_2, 30_3, \ldots$ is selectively connected to a control voltage source through one of the switches $Sw_1, Sw_2, Sw_3, \ldots$ in a switching array.

Those skilled in the art to which the invention relates will appreciate that variations, additions, deletions and substitutions can be made in the described example embodiments, without departing from the spirit and scope of the invention, as defined by the claims.

The invention claimed is:

1. A phase locked loop circuit, comprising:
a voltage controlled oscillator that has a control input to which a variable control voltage is applied;
a loop filter;
a phase-frequency discriminator with an output connected to the loop filter to produce the control voltage;
a plurality of discrete frequency tuning elements; and
a switch array selectively activating and deactivating each of said frequency tuning elements in said voltage controlled oscillator to determine partial ranges of frequencies through each of which the oscillator can be tuned by a variation of said control voltage in a range between predetermined upper and lower control voltage limits, wherein a total frequency range through which said oscillator can be tuned is divided into a plurality of partial frequency ranges each defined by a different number of activated frequency tuning elements;
an inhibiting circuit that is set whenever one of said frequency tuning elements is activated or deactivated to inhibit an activation or deactivation of further frequency tuning elements, and that is reset only after the control voltage has evolved away from said upper or lower control voltage limit by a predefined amount; and
wherein the loop filter includes a filter capacitance and, during the set condition of the inhibiting circuit, the phase-frequency discriminator is functionally disconnected from the loop filter and the capacitance is selectively connected to a charge sink or to a charge source to reduce or increase the control voltage applied to the control input of the voltage controlled oscillator.

2. The phase locked loop circuit according to claim 1, wherein said plurality of partial frequency ranges overlap each other.

3. The phase locked loop circuit according to claim 1, comprising a threshold comparator that monitors said control voltage and controls said switching array to activate or deactivate one of said frequency tuning elements when either of said upper and lower control voltage limits is reached or exceeded.

4. The phase locked loop circuit according to claim 1, wherein the control voltage is forced away from the control voltage limit during the set condition of the inhibiting circuit.

5. The phase locked loop circuit according to claim 1, wherein a charge pump associated with the loop filter is supplied with a variable charge current to compensate for a change in loop bandwidth on activation or deactivation of one of the capacitors.

6. The phase locked loop circuit according to claim 1, wherein the frequency tuning elements are formed by fixed capacitors.

7. The phase locked loop circuit according to any of claim 1, wherein the frequency tuning elements are formed by current sources.

* * * * *